United States Patent [19]

Ingle et al.

[11] 4,416,913
[45] Nov. 22, 1983

[54] ASCENDING DIFFERENTIAL SILICON HARVESTING MEANS AND METHOD

[75] Inventors: William M. Ingle; Robert D. Darnell, both of Phoenix, Ariz.; Stephen W. Thompson, Rosenberg, Tex.

[73] Assignee: Motorola, Inc., Schaumburg, Ill.

[21] Appl. No.: 425,832

[22] Filed: Sep. 28, 1982

[51] Int. Cl.³ .............................................. C23C 11/00
[52] U.S. Cl. .................................. 427/45.1; 118/716; 423/350; 427/86; 427/212; 427/215
[58] Field of Search ................. 427/45.1, 38, 39, 86, 427/212, 215; 423/324, 349, 350; 118/716

[56] References Cited

U.S. PATENT DOCUMENTS

| | | | |
|---|---|---|---|
| 3,012,861 | 12/1961 | Ling . | |
| 3,012,862 | 12/1961 | Bertrand et al. . | |
| 3,528,179 | 9/1970 | Smith | 34/1 |
| 3,963,838 | 6/1976 | Setty et al. | 427/213 |
| 4,019,890 | 4/1977 | Fujita et al. | 427/212 |
| 4,084,024 | 4/1978 | Schumacher | 427/215 |
| 4,147,911 | 4/1979 | Nishitani | 219/10.55 |
| 4,154,870 | 5/1979 | Wakefield | 427/215 |
| 4,207,360 | 6/1980 | Padovan | 427/86 |
| 4,272,344 | 9/1981 | McHale | 427/45.1 |
| 4,314,525 | 2/1982 | Hsu et al. | 427/86 |

FOREIGN PATENT DOCUMENTS 544029 7/1957 Canada ...................... 427/213

OTHER PUBLICATIONS

Ingle et al., "NASA Tech. Briefs", Winter 1980, p. 497.
Yerushalmia et al., "AICHE Symposium Series", vol. 73, No. 161, pp. 44-50, 1977.

Primary Examiner—John H. Newsome
Attorney, Agent, or Firm—Robert M. Handy

[57] ABSTRACT

An improved means and method for extracting polycrystalline silicon from silicon source gases is provided wherein seed particles and source gases are reacted in a rising particle reaction chamber in which the gas velocity is sufficient to entrain and eject all seed particles smaller than a predetermined size while those which have grown to a larger size fall through the rising gas stream and are extracted from the base of the reactor. Those seed particles which are ejected from the reaction column are separated from the spent gases and fall back into a concentric reservoir. A first gas not containing any silicon is supplied to a nozzle within the reservoir and creates a first gas-particle mixture which is injected into an auxiliary mixing chamber, where it is further mixed with a high velocity lifting gas which includes the source gases. The lifting and source gas-particle mixture is swept through the reactor where silicon deposits on the seed particles. The seed particles recirculate from reaction column to reservoir to reaction column until they have achieved sufficient size so as to be automatically harvested by the differential lifting action in the reaction column.

19 Claims, 4 Drawing Figures

— PRIOR ART —

ASCENDING DIFFERENTIAL SILICON HARVESTING MEANS AND METHOD

BACKGROUND OF THE INVENTION

1. Field of the Invention

This invention relates in general to means and methods for producing chemical vapor deposition (CVD) reactions on seed particles and, more particularly, to improved means and methods for converting silicon and similar materials from gaseous to solid form.

2. Background of the Invention

High purity silicon, germanium, and like materials are much used for the production of semiconductor devices. High purity silicon is typically obtained, for example, by thermal decomposition of silicon bearing gases which have been refined to remove, insofar as possible, all impurities. The thermal decomposition is most easily accomplished on a heated surface which becomes coated with the elemental silicon released from the silicon bearing gases. This process is called chemical vapor deposition (CVD). The avoid introducing extraneous contamination, it is desirable that the starting or "seed" surface on which CVD occurs also be made of high purity silicon.

Fluidized bed reactors are a useful means of bringing large numbers of solid particles in intimate contact with a reactant gas. They have long been used for the production of gaseous silicon bearing compounds by passing etchants such as HCl vapor through a fine bed of silicon particles, to produce gaseous silanes and chlorosilanes which can then be readily purified. More recently, attempts have been made to use fluidized beds as a means for extracting silicon from purified silane and chlorosilane compounds.

If a silicon bearing gaseous compound is passed through a fluidized bed of silicon seed particles at a temperature of about 1,000° C., the silicon bearing compound will decompose, depositing elemental silicon on the seed particles, which thereby increase in size. However, when fluidized beds are used for the production of elemental silicon, as opposed to silicon bearing gases, great practical difficulties are encountered. In particular, as the silicon particles in the bed grow in size they tend to agglomerate into clumps, effectively glued together by the silicon being deposited on their surfaces from the CVD reaction. This agglomeration leads to a reduction in the throughput and efficiency of the reaction since the agglomerated particles have a smaller total surface area than the separate individual particles, and the reaction rate and conversion efficiency depend upon the total available surface area.

A further area of difficulty which has been encountered with the use of fluidized beds of harvesting of silicon is that the fine holes which are present in the particle support plate of the typical fluidized bed reactor, become clogged with deposited silicon or with silicon particles. This reduces the throughput capacity of the bed and requires frequent shut-downs to clean out the holes or replace the plates. A particle support plate is a gas permeable plate placed at the bottom of a fluidized bed to support the particles in the bed while allowing gas to pass through and create the boiling-like turbulance, that is characteristic of a fluidized bed.

An additional problem associated with fluidized silicon harvesting beds of the prior art is that there is no effective means, short of stopping the reaction and emptying the bed, for separating those particles on which a substantial amount of silicon has been deposited from those particles which have grown in size by agglomeration but on which relatively little silicon has been deposited. Both have about an equal tendency to settle to the bottom of the bubbling mass of particles in the bed. Thus, agglomeration greatly interferes with one's ability to separate particles on which significant deposition has occurred. As a consequence, the silicon removed from the prior art reactors contains a larger proportion of seed material than is desired. This increases the cost of operation, both for the additional seed material required per unit weight of output and for the additional energy wasted in heating the additional seed material.

For these and other reasons, it has not proved practical to operate fluidized bed silicon harvesting systems efficiently and in a continuous fashion without encountering substantial operating and maintenance problems.

Accordingly, it is an object of the present invention to provide an improved CVD reactor system in which finely divided seed particles are brought in contact with a reactant gas comprising the material to be deposited.

It is an additional object of the present invention to provide an improved CVD reactor system in which particle agglomeration is minimized or avoided, and which readily permits differential separation of reacted and non-reacted particles so that those particles on which significant CVD has occurred may be readily harvested while others are left to react further.

It is a further object of the present invention to provide a reactor system of improved thermal configuration for greater energy efficiency.

It is an additional object of the present invention to avoid the problems associated with the clogging of particle support plates by avoiding the use of such plates.

It is a further object of the present invention to provide an improved method for the harvesting of silicon from silicon bearing gases within a CVD reaction system.

It is an additional object of the present invention to provide an improved method for harvesting silicon, particularly semiconductor grade silicon, from silicon bearing gases which can be operated in a substantially continuous manner.

It is a further object of the present invention to provide an improved reactor system in which additional seed particles can be added, in which particles already in the system can be circulated through multiple CVD cycles, and in which reacted particles can be harvested without substantially interrupting operation of the reactor systems.

SUMMARY OF THE INVENTION

An improved means and method for extracting material from a source gas is provided wherein silicon seed particles and the source gas are reacted in a rising particle reaction column to deposit or add material from the source gas onto the seed particles. The gas velocity in the reaction column must be sufficient to lift, transport, and eject all seed particles smaller than a predetermined size while those which have grown to a larger size fall through the rising gas stream and are extracted from the base of the reactor. Those seed particles which are ejected from the reaction column are separated from the spent gases in an expansion chamber and fall back into a reservoir, preferably concentrically arranged surrounding the reaction column. An injection gas, not containing any source material, is supplied to a first mixing means preferably within the seed particle reservoir. A first gas-particle mixture is formed in the first mixing means and injected into the reactor or into an auxiliary mixing chamber ahead of the reactor, where the first gas-particle mixture is further mixed with a source gas. The source gas may be combined with a high velocity lifting gas. The lifting and source gas-particle mixture flows into the reactor where reaction with and/or deposition on the seed particles occurs. The seed particles pass through the reaction column to the reservoir and automatically recirculate back to the reaction column until they have achieved sufficient size so as to be automatically harvested by the differential lifting action in the reaction column. No particle support plates are needed in either the reservoir or reaction column. It is essential that the mixing and/or injection means used to inject the seed particles into the reaction column or auxiliary mixing chamber prevent any feed-back or leakage of the input source gas into the reservoir. A constricted region in the auxiliary mixing chamber or in the ports giving access to the reactor or mixing chamber assist in preventing this feed-back. It is desirable to heat the seet particles to a higher temperature than the reactor walls. Microwave heat sources are useful for this purpose.

There is further provided a process for coating seed particles with material derived, at least in part, from a source gas, comprising: introducing seed particles of less than a first predetermined size into a reservoir, such as has been described above; introducing into the reservoir a first gas or gases not containing any reactable source material, for agitating the particles within the reservoir and providing a first gas-particle mixture; injecting the first gas-particle mixture into a stream of a lifting gas which desirably comprises the source gas, to form a second gas-particle mixture, and without substantial feedback of the source gas into the reservoir; flowing the second gas-particle mixture through the reaction chamber so as to have a first predetermined velocity of the lifting gas in the reaction chamber; regulating the first predetermined gas velocity in the reaction chamber so that substantially all particles less than a second predetermined size greater than said first predetermined size are substantially carried through the reaction chamber toward an outlet end; heating the second gas-particle mixture to react with and/or reduce the source gas therein to form the coatings on the seed particles, thereby producing larger particles and spent gases; collecting in the reaction chamber the coated particles whose size is greater than the second predetermined size; ejecting from the outlet end of the reaction chamber the spent gases and substantially all particles whose size remains less than the second predetermined size; decelerating the ejected gases to reduce their velocity so that the particles entrained in the ejected gases are no longer lifted but fall out and are collected in the reservoir to provide seed particles for subsequent reactions; extracting and optionally recycling the spent gases; and harvesting the collected particles by extracting them from the base end of the reaction chamber. The lifting gas can be provided separately, mixed with the source gas, mixed with the injection gas, or a combination thereof. It is desirable to heat the seed particles hotter than the reaction chamber walls. Microwave heating is useful for this purpose. Alternatively the reaction chamber walls can be cooled, or both methods used.

DETAILED DESCRIPTION OF THE DRAWINGS

Figure 1:
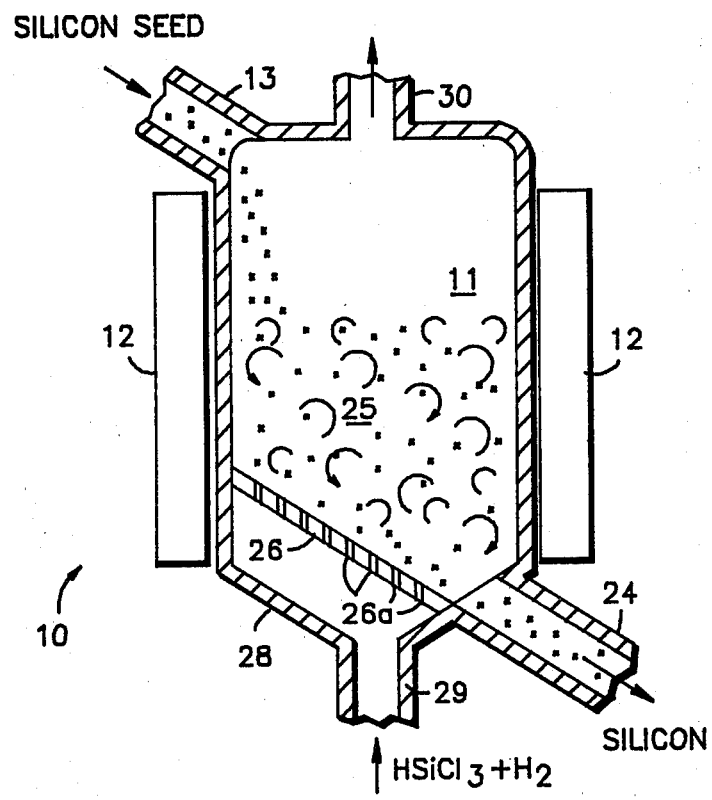
FIG. 1 is a cross-section view of a fluidized bed reactor of the prior art utilized in the production of silicon.

FIG. 1 shows a cutaway view of a quartz fluidized bed reactor used for the production of silicon according to the prior art. Fluidized bed reactor 10 has vertically oriented cylindrical reaction chamber 11 with conical bottom 28. A reactive and fluidized gas containing a source of silicon, in this case trichlorosilane plus hydrogen, enters reaction chamber 11 through inlet 29. Inlet 13 is provided for introducing silicon seed particles, and outlet 24 is provided for withdrawing particles of increased size, after they have reacted with the silicon source gas and settled to the bottom of the bed. Heater coils 12 provide heat to reaction chamber 11 to maintain fluidized silicon particles in bed 25 at temperatures ranging from about 950°–1250° C. Spent gases are extracted through outlet 30. Gas distribution and particle support plate 26 is porous so that gases entering through inlet 29 may pass upward into the reaction zone of chamber 11 through small holes or pores 26a while at the same time silicon particles within fluidized bed 25 are prevented by support plate 26 from falling into conical end portion 28.

In operation, silicon seed particles are introduced through inlet 13 and reactant gases through inlet 29 in sufficient quantities to produce a bubbling fluidized bed 25 in which the silicon seed particles come in contact with the silicon bearing reactant gase. The silicon bearing gases decompose, depositing additional silicon on the seed particles. The larger and thus heavier particles tend to settle to the bottom of bed 25. After a sufficient time, outlet 24 is opened, the enlarged silicon particles are harvested, and additional seed particles once again inserted through tube 13. Gas velocities within fluidized bed 25 are generally less than 30 cm per second. Continuous operation can be obtained, but with difficulties of the sort described previously.

It has been found that particle agglomeration and plugging of particle support plate 26 are significant problems which interfere with continuous operation of the reactor. Agglomeration is particularly troublesome because it decreases the throughput and the reaction efficiency, that is, the amount of silicon in the silicon source gas which is converted to elemental silicon deposited on the seed particles. In reactors of this type, typically 75–80% of the reactable silicon in the source gas stream remains unconverted and is lost through exhaust vent 30. Agglomeration of the seed particles reduces their surface to volume ratio so that they settle to the bottom of the bed and are harvested before significant amounts of silicon have been deposited thereon. Agglomerated particles consist mostly of the input seed material with relatively little added silicon.

A common feature of prior art fluidized bed silicon reactors is that the seed particles remain within the bed and are not carried along with the spent or reacted gases exiting the reactor through outlet 30. This provides substantial opportunity for particle-particle contact which promotes agglomeration.

Figure 2:
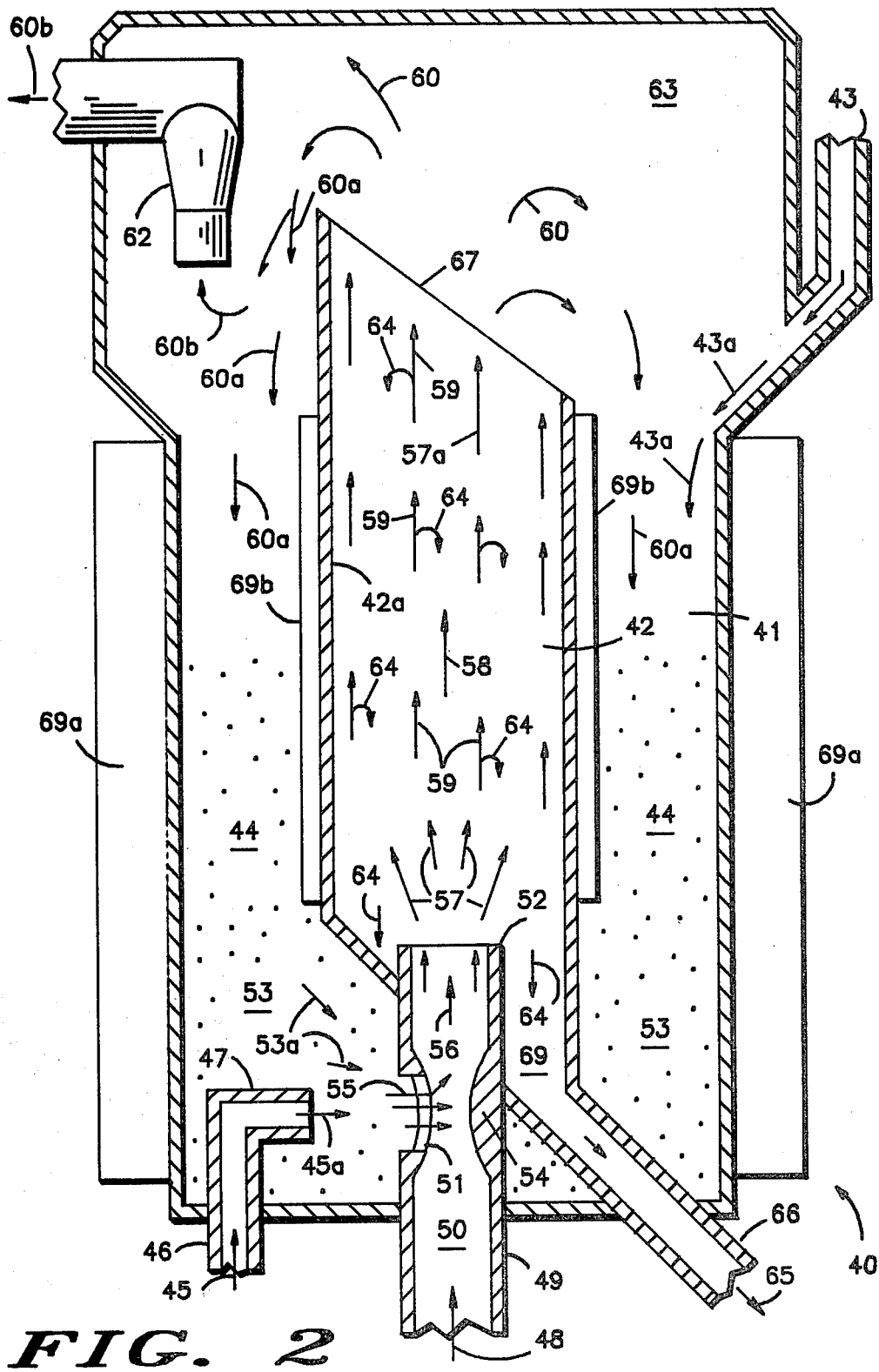
FIG. 2 is a schematic cross-section in simplified form of a rising particle reactor system according to the present invention.
Figure 4:
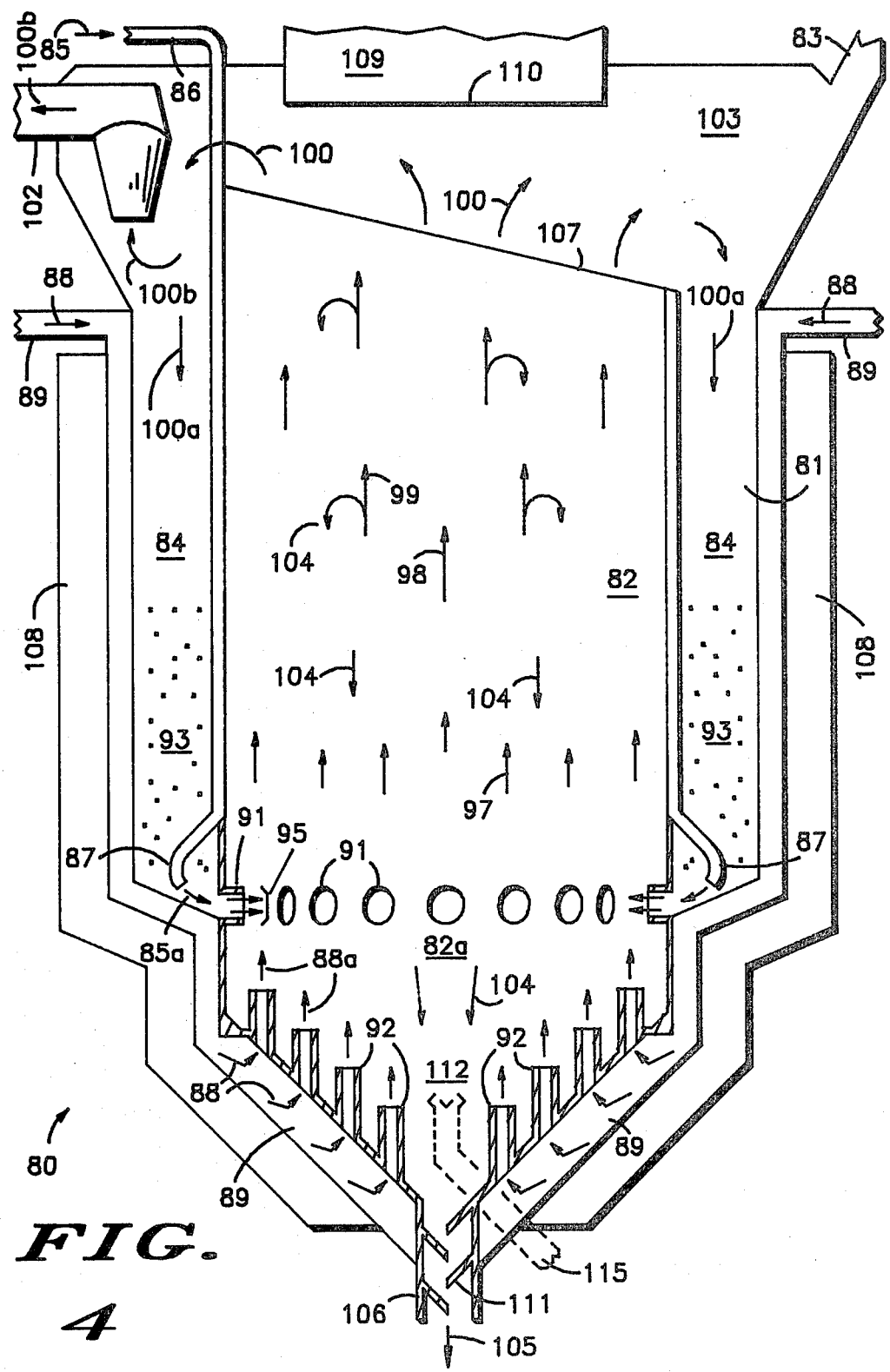
FIG. 4 shows a simplified cross-section of a rising particle reactor system of the present invention according to a further embodiment.

These and other problems of the prior art reactors are avoided by means of the rising particle reactor system of the present invention illustrated in different embodiments in FIGS. 2 and 4. By way of example, the rising particle reactor means and method of the present invention will be described in terms of its use for the harvesting of elemental silicon from silicon bearing gases. However, those of skill in the art will recognize that the structural features and operation of the present invention are more general and apply to a wide variety of materials and reactions in which seed particles are desired to be introduced into a reactor, reacted with one or more gases, and thereafter extracted.

FIG. 2 shows a schematic representation, in simplified form, of the cross-section of rising particle reactor system 40 comprising concentric cylindrical reservoir column or chamber 41 for retaining seed particles surrounding a substantially cylindrical reactor column or chamber 42. Seed particles, in this example silicon seed particles, are introduced into reservoir 41 by seed particle inlet means 43. A hopper pressurized with an inert or reducing gas is a suitable seed particle inlet means. Seed particles 43a introduced through inlet 43 fall by gravity into annular shaped lower portion 44 of reservoir 41 to maintain in lower portion 44, a supply of seed particles 53 sufficient to support the operation of the reactor. The quantity of seed particles 53 required to be present in annular reservoir space 44 can be readily determined by experiment.

Lifting and source gas 48, containing silicon in this example, or in the case of other substances, containing the material to be deposited, is introduced at inlet 49. As used herein, the words "source gas" refer to a gas or gas mixture containing the material to be deposited or formed on the seed particle or which is an ingredient of the material to be deposited or formed on the surface of the seed particles. A non-source gas is a gas or gas mixture substantially not containing such material or ingredient or containing such material in an inert non-reactable form. For the production of silicon, silanes, chlorosilanes, and/or a mixture thereof diluted with a carrier gas are suitable for lifting and source gas 48. Lifting and source gas inlet 49 comprises mixing tube or chamber 50 having gas-particle inlet hole 51 and injection nozzle 52.

First injection gas 45 is supplied by means of inlet 46 to nozzle 47 located preferably within lower portion 44 of annular reservoir 41 and immersed in seed particles 53. First injection gas 45 must be a non-source gas, that is, substantially free of compounds which would react in the presence of seed particles 53 to produce agglomeration. For example, in a silicon harvesting reactor, first injection gas 45 must not contain any reduceable silicon bearing compounds. Hydrogen has been found to be suitable for first injection gas 45, although other inert or source-free gases could be used, for example, helium or argon. Hydrogen is also useful as a lifting gas, and is used for diluting the source compounds in lifting and source gas 48.

As stream 45a of first injection gas 45 exits nozzle 47, a portion 53a of seed particles 53 is swept into gas stream 45a to form first gas-particle mixture 55, which by virtue of the pressure and velocity exerted by gas stream 45a is swept into hole 51 located in the side of source gas inlet 49 and mixing chamber 50. It is convenient that mixing chamber 50 have constriction 54 in the vicinity of side hole 51 so that advantage is taken of the Bernoulli effect, wherein the pressure within mixing chamber 50 in the vicinity of hole 51 is thereby reduced. It is essential that no significant portion of lifting and source gas 48 being forced through mixing chamber 50 escape via side hole 51 into reservoir 41 where the source gas would likely cause agglomeration of seed particles 53. As has been noted previously, avoiding seed particle agglomeration is a particular objective and feature of the present invention. It has been found that feedback or leakage of lifting and source gas 48 into lower reservoir portion 44 containing seed particles 53 is avoided when sufficient pressure of gas 45 is applied to inject first gas-particle mixture 55 through hole 51 into mixing chamber 50. This process is assisted by providing constriction 54 in the vicinity of hole 51.

First gas-particle mixture 55 impinges on lifting and source gas 48 within mixing chamber 50. First particle-gas mixture 55, and lifting and source gas 48 combine to produce second gas-particle mixture 56 in mixing chamber 50. Lifting and source gas 48 must have sufficient velocity that all particles injected into mixing chamber 50 by first gas-particle mixture 55 are blown upward, i.e. lifted and transported to ejection nozzle 52, where they escape into reaction column 42. The cross-sectional areas of mixing tube 50 and nozzle 52 are smaller than the cross-sectional area of reaction column 42. Second gas-particle mixture 56 when injected through nozzle 52 forms rising, i.e. ascending, source gas-particle mixture 57 within reaction column 42.

Velocity 58 of rising source gas-particle mixture 57 must be sufficient that substantially all particles 59 smaller than a predetermined or critical diameter are entrained within rapidly flowing gases 57a of source gas-particle mixture 57, and lifted and transported toward reaction column exit 67. Ascending particles 59 flow upward through reaction column 42 and are ejected from reaction column exit 67. Remaining particles 64 which have grown larger than this predetermined or critical size will not be lifted and transported by gas stream 57a but will fall back down through reaction column 42 to region 69 at the base of reaction column 42 where they can be extracted as harvested material 65 through outlet 66. A more detailed discussion of this differential harvesting action is provided later.

Spent gas-particle mixture 60, consisting of spent gases 60b and ejected particles 60a, leaves exit 67 of reaction column 42 and enters deceleration space 63, which has a larger diameter than reaction column 42, thereby undergoing a reduction in velocity. As the velocity of ejected spent gases 60b drops, ejected particles 60a are no longer lifted and they fall back into lower portion 44 of concentric reservoir 41 to replenish seed particle supply 53. Spent gases 60b are extracted by means of cyclone separator 62 which, although not essential, is desirable to remove any extremely fine particles which may still be contained within the spent gas stream. Spent gases 60b can contain unreacted or undecomposed source gas. In general, it is desirable that the reaction column height be sufficient to permit as much as possible of the source gas to decompose and/or react with the seed particles.

Heaters 69a–b surround reservoir 41 and reaction column 42 to maintain the system at the necessary temperature to promote the desired reactions. Other heaters may also be used. Alternatively a cooling jacket can be used in place of heater 69b so that inner walls 42a of reaction column 42 are maintained at a lower temperature than reservoir 41, seed particles 53, and/or gas stream 57a. This is desirable since CVD then occurs principally on hotter seed particles 59 and 64 in reaction column or chamber 42 rather than on relatively cooler reaction column walls 42a. Direct microwave heating of seed particles 53 is another method of raising the temperature of particles 53 relative to interior walls 42a of reaction column 42. The rapid re-circulation of particles between reservoir chamber 42 and reaction chamber 41 facilitates keeping the reacting seed particles hotter than walls 42a since the two chambers can be kept at different temperatures. Prior art fluidized bed reactor 10 does not have this capability since the seed particles remain in bed 25 until harvested. Wall deposition is a well known problem in prior art fluidized bed silicon reactors.

In addition to providing for mixing and injection of particles 53 from reservoir 41 into mixing tube 50, gas 45 also provides the important function of aerating particles 53 within reservoir 41 so that they are maintained in a relatively loose state and can be readily picked up by gas stream 45a and swept through side hole 51 into mixing tube 50. That portion of first injection gas 45 which serves to aerate seed particle supply 53, flows upward through reservoir 41 and is extracted via separator 62. This prevents residual source gas in spent gases 60b from reaching seed particle supply 53 in region 44 and causing agglomeration therein. Gas stream 45a after being combined with gas 48 contributes to the lifting action of rapidly flowing combined gases 57a in reaction column 42.

It will be appreciated by those of skill in the art that the proportion of the lifting action in reaction column 41 which originates with gases 45 or 48 is a matter of choice by the user, and while it is convenient here that gas 48 provide the principle source of lifting action, this need not always be so. Even though gas 48 is referred to as the lifting gas, it is to be understood that lifting is also provided in part by injection gas 45, and that, if desired, gas 45 can provide the principal lifting action. What is essential is that combined gas 57a in reaction column 42 have sufficient velocity to lift and transport particles 59, and that particle injection and reservoir aeration gas 45 not contain any reactable source gas.

Figure 3:
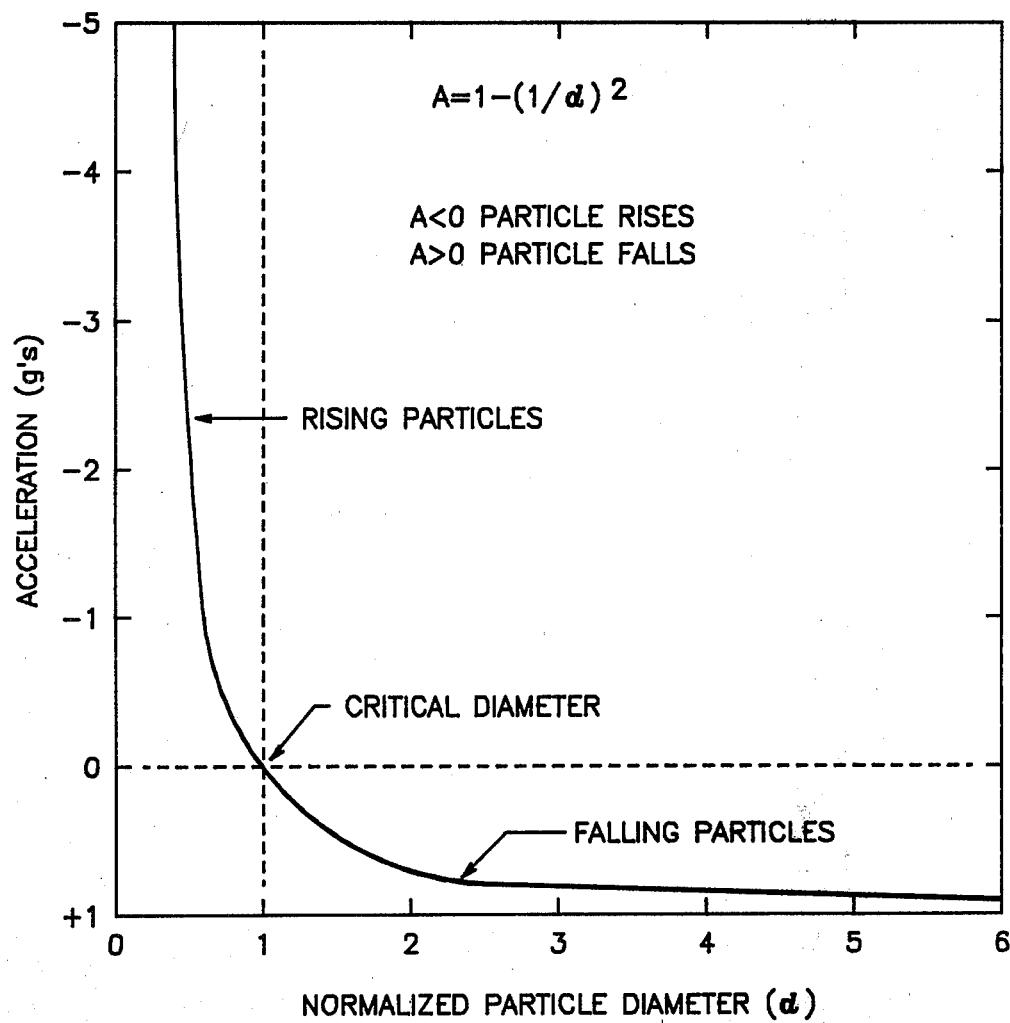
FIG. 3 is a plot of the relationship between the acceleration experienced by a spherical particle placed in a moving gas and the normalized particle diameter, as derived using Stokes Law.

The relationship between the lifting force or acceleration experienced by a particle and the velocity of the lifting gas stream can be estimated by the use of Stokes Law. The lifting force is opposed by the gravitational force. It can be shown that a spherical particle of diameter D placed in a rising gas stream of velocity V will experience a net acceleration A, expressed in gravitational units (g's), of $$A = 1 - (1/d)^2,$$

where $d = D/D_o$ is the normalized particle diameter. The reference (i.e. critical) diameter $D = D_o$ is the diameter of a particle at which the viscous lifting force of the gas just counterbalances the gravitational force, and is given by $$D_o = C_o(V_o)^{\frac{1}{2}}$$

where $V_o$ is the predetermined gas velocity and $C_o$ is a known constant dependent upon the properties of the gas and the density of the particle material. The relationship between the acceleration A and normalized diameter d is plotted in FIG. 3, wherein the negative (upward directed) acceleration axis points up.

For $d=1$ the lifting and gravitational forces are balanced. For $d<1$ the particles rise ($A<0$), and for $d>1$ the particles fall ($A>0$). Near the critical diameter $D_o$, the acceleration depends approximately upon the square of the particle diameter. Thus, small changes in particle diameter around $D_o$ can produce large changes in the magnitude and direction of the acceleration. For example, for $d=0.5$ (half the critical diameter $D_o$), the particles experience an upward acceleration of three g's, while for $d=2$ (twice the critical diameter), the particles experience a downward acceleration of 0.75 g. The downward acceleration asymptotically approaches one g. Thus, it can be seen that the reaction system of the present invention has a strong differential harvesting action as the seed particles change in size. Seed particles having $D<D_o$ experience strong upward acceleration and are transported through the reactor to be recycled. Once they have grown to a size where $D>D_o$ they are no longer lifted and transported, but fall through the rising gas to the bottom of the reactor. Usually, several passes through the reaction column are required for a seed particle to reach a reasonable predetermined critical size and be harvested.

The critical diameter $D_o$ at which harvesting begins can be predetermined by proper adjustment of the velocity of the lifting gas. The relation $V_o = (D_o/C_o)^2$ is useful for estimating the required gas velocity. However, the particles are not perfect spheres and Stokes Law is only approximately correct. Hence it is desirable that the particular reactor being employed be calibrated by experiment. This can be readily accomplished by using particles of a known size and measuring the gas velocity required to obtain lifting and transport.

It is important that certain relationships exist between cross-sectional area $A_1$ measured perpendicular to gas stream 57a of reaction chamber or column 42, cross-sectional area $A_2$ of reservoir 41, and cross-sectional area $A_3$ of deceleration space or expansion chamber 63. These relationships arise from the need to have differential particle lifting in reaction column 42, separation of the ejected particles and spent gases in deceleration space 63 and collection of the ejected particles in reservoir 41. It is desirable that $A_1$, $A_2$ and $A_3$ are related so that $A_1 = XA_2$ and $A_1 = YA_3$, where X is in the range 0.05 to 0.25, Y is in the range 0.0125 to 0.125, and X/Y is in the range 2 to 10. It is preferable that X be in the range 0.08 to 0.2, Y be in the range 0.04 to 0.1, and X/Y be in the range 2 to 5.

The present invention contains several features which distinguish it over prior art fluidized bed systems and methods used for forming coatings or depositing materials, as for example, for harvesting silicon.

(1) No particle support plates are required in the present system, neither in the reaction column nor the reservoir. Hence, the support plate clogging problems associated with the prior art systems are avoided.

(2) Seed particles 53 contained within annular, concentric, reservoir 41 automatically provide an insulating jacket for reaction column 42, thereby reducing the heat loss and increasing the efficiency of the reactor. Further, the annular construction of surrounding the reaction column with the reservoir automatically maintains particles 53 within annular space 44 at or close to the desired reaction temperature. Further by using microwave heating of the seed particles and/or cooling the inner walls of the reaction chamber, the seed particles can be kept hotter than the reaction chamber walls so that CVD on the walls is reduced or avoided. The concentric reservoir structure is also compact and simple to construct, and, as shown in connection with FIG. 4, readily permits angularly symmetric and uniform particle flow back to the reaction chamber.

(3) The seed particles present within reaction column 42 are not maintained within a fluidized bed, but, so long as they remain below the predetermined critical size, are entrained within the gas stream, lifted and transported through and out of reaction column 42 by the force of the inlet gases. They recirculate through reservoir 41 automatically.

(4) Since the particles are not maintained within a fluidized bed in the reaction column, the particle to particle contact is reduced to such a level that agglomeration within the reaction column is essentially eliminated.

(5) Unlike prior art fluidized beds, there is no bubbling action which permits bubbles of reactant gas to pass through the bed and reaction column without intimate contact with the seed particle. By contrast, in the present reactor the particles pass essentially individually through the reaction column and therefore have maximum opportunity to contact the decomposing reactant gases. This increases the efficiency of deposition and provides for improved conversion of the source material into solid silicon.

(6) Those particles which have acquired a sufficiently thick coating of silicon as a result of their contact with the decomposing source gases are automatically separated from the smaller particles which have not yet acquired sufficient silicon. Thus the present reactor system provides for automatic differentiation between particles to be harvested and those to be recycled. Those particles which have not yet reached the desired size for harvesting are automatically returned to the concentric reservoir for recycling. Premature harvesting of agglomerated particles is avoided.

(7) The differential harvesting action of the present invention is unlike that of the fluidized beds of the prior art and is believed to be more pronounced. In prior art fluidized beds, used for example for silicon harvesting, the particles remain in the bed. Even though the bed expands as the gases aerate the bed and produce a turbulent boiling action (i.e. fluidization), particle transport of the sort described in the present invention does not occur. Rather than being lifted and transported by streaming gases, as in the present invention, the particles in the fluidized bed are constantly being bumped and supported by other particles. In prior art fluidized beds, there is no counterpart to the condition $d<1$. Prior art fluidized beds for harvesting silicon operate under conditions which are equivalent to $d>1$. In this range, the difference in force (or acceleration) experienced by particles of different size is much less pronounced than with the present invention. This can be readily appreciated from FIG. 3 by noting that for $d>1$ the slope of the curve is decreasing and approaching zero while for $d<1$ the slope is increasing and approaching infinity. The magnitude of the differential harvesting action depends on the slope of the curve in the regieme of operation. The present invention separates particles more strongly by operating on both sides of the critical point ($d=1$), while fluidized beds of the prior art operate only to the right of the critical point ($d=1$).

The following is an example of the use of the reactor of FIG. 2 to harvest elemental silicon. Rising particle reactor 40 was constructed of quartz tubing with a reaction column diameter of approximately 25 mm, a reservoir column diameter of approximately 75 mm, and a combined height of approximately 2 m. Prior to being introduced via feed port 43, the silicon seed particles were screened to have a size in the range of 80-200 mesh, i.e. 0.13-0.32 mm, although particles of two to three times this size could be lifted. The resistivity of the silicon seed particles was determined to be greater than 200 ohm-cm. Lifting and source gas 48 consisted of, in mole percent, $H_2SiCl_2$ 6.6%; $HSiCl_3$ 3.4%, $H_2$ 90%. Hydrogen was also used as first injection gas 45.

The reactor was purged with inert gases and/or hydrogen and an initial charge of silicon seed particles 53 was introduced via inlet 43 so as to partially fill the lower one-fourth to one-third of annular reservoir 41. Initially, pure hydrogen was introduced through source gas inlet 49 and a flow rate established sufficient to give flow velocity within reaction column 42 of about one-half to several meters per second, although velocities as low as 0.3 m per sec. are believed useful for small seed particles. The flow rate of first injection gas 45 (hydrogen) was adjusted to give substantial injection of seed particles 53 into mixing tube 50 so that seed particles 53 begin to circulate rapidly through reaction chamber 42 and back into reservoir 41. This also served to aerate seed particle supply 53 in reservoir 41. The reactor was then brought up to temperature, generally in the range 1050°-1100° C. by means of heater 69a. In this experiment, heater 69b was omitted.

Silicon source gases where then introduced into lifting gas stream 48 and the flow rates adjusted to give the proportions noted above, while still keeping total flow velocity 58 within reaction column 42 in the range one-half to several meters per sec. This flow velocity within reaction column 42 was sufficient to initially lift substantially all seed particles 53. This corresponds to a value of $D_o>0.32$ mm. With the introduction of the silicon source gases into the reactor, the silicon seed particles begin to rapidly grow in weight and size due to CVD of silicon from the source gases. It was found that when the silicon seed particles had increased in volume by a factor of 6 to 10 over their initial size that they were substantially no longer lifted by gas stream 57 in reaction column 42, and the enlarged particles commenced to settle out and be harvested. This corresponds to D becoming larger than $D_o$. It was determined that on the average, a particle would cycle approximately five times through the reaction column and reservoir in order to acquire sufficient increase in weight to fall out and be harvested.

In a typical run, approximately 1.4 kilograms of silicon seed particles were introduced into the reactor. After passing approximately 20.4 kilograms of $H_2SiCl_2$ and 13.6 kilograms of $HSiCl_3$ source gases through the reactor in contact with tbe circulating seed particles, the harvested seed particles had undergone a weight gain of approximately 2.8 kilograms. These results indicate a recovery efficiency of 33%. This is to be compared with typical prior art recovery efficiency of 20-25%. The recovery efficiency is given by the weight gain of the harvested seed particles divided by the weight of available silicon in the source gases passed through the reactor during operation. In trial runs, an average growth rate of 0.28 kilograms per hour was obtained consistently over a ten hour period. The harvested material was used to produce a single crystal silicon ingot which was found to be uncompensated P-type having a resistivity of 150–180 ohm-cm. The harvested material was of a quality useful for the production of semiconductor devices.

FIG. 4 shows a reactor, in schematic and simplified cross-sectional form, according to a further embodiment of the present invention. Recirculating rising particle reactor 80 comprises concentric seed particle reservoir 81 surrounding substantially cylindrical reaction column 82. Starting seed particles are admitted to the reactor through port 83 from whence they fall into annular region 84 of reservoir 81. A feature of this embodiment is that lifting and source gas 88 and particle injection (non-source) gas 85 are admitted to the reactor system in such a way that prior to their actual entry into reaction column 82 they are pre-heated by being brought into thermal contact with cylindrical reservoir 81 and/or reaction column 82. This arrangement advantageously cools the inner walls of reaction column or chamber 82 and mixing chamber 82a relative to the seed particles. This is important since it reduces deposition of material from source gas 88 onto the inner walls of column 82, relative to deposition on the hotter seed particles.

Lifting and source gas 88 enters through inlet port 89 and travels in thermal contact with the walls of reservoir 81 into manifold 89 from whence it is admitted to mixing chamber 82a at the base of reaction column 82 through nozzles 92. Injection (non-source) gas 85 enters through inlet 86 and travels in thermal contact with the walls of reaction column 82.

Injection gas 85 is delivered to injection nozzles 87. Injection nozzles 87 face toward a series of small openings or ports 91 in the side of mixing chamber 82a at the base of reaction chamber 82, which provide for communication between lower portion 84 of reservoir 81 and mixing chamber 82a. Injection gas stream 85a exits nozzle 87 and picks up a portion of seed particles 93 in reservoir 81 to form first gas-particle mixture 95 which is injected through ports 91 into mixing chamber 82a. Upon injection into mixing chamber 82a, first gas-particle mixture 95 encounters rapidly rising stream 88a of lifting and source gas 88 with which it mixes to form lifting source gas-particle mixture 97 having gas velocity 98. Lifting source gas-particle mixture 97 proceeds directly to reaction column 82. With the concentric arrangement of reservoir 81 around reactor 82, injection ports 91 can be uniformly spaced around the lower end of reactor 82 so that particle injection into mixing chamber 82a and reactor 82 is also uniform. This promotes a uniform distribution of particles within the reactor which is of aid in achieving high throughout and efficiency.

Velocity 98, as before, must be sufficient to substantially lift and transport particles 99 smaller than a predetermined size so that they are ejected from reaction chamber outlet 107, while large and heavier particles 104 which cannot be lifted by gas stram 97 of velocity 98 fall back toward base portion or sump 112. As discussed in connection with FIG. 2, spent gas and ejected particle mixture 100 is separated in expansion chamber 103 so that ejected particles 100a fall back into annular reservoir portion 84 to replinish particles 93, while separated spent gases 100b exit the reactor by means of cyclone separator 102 or equivalent.

In this embodiment of the present invention, mixing of the seed particles with the source gas takes place within mixing chamber 82a which forms the lower part of the reaction column. Feedback or leakage of source gases 88 into reservoir portion 84 through ports 91 is prevented by maintaining a sufficient velocity of injection gas 85a directed toward ports 91. The constrictions provided by ports 91 assist in preventing this feedback. The required velocity of injection gas stream 85a can be readily determined by experiment. Larger and heavier particles 104 which can no longer be lifted by gas 97 fall to sump 112 where they move by gravity into outlet port 106, passing through baffles 11, to make up harvested silicon particles 105.

A feature of the embodiment of the invention illustrated in FIG. 4 is that heating the particles in the reservoir and/or the reactor is provided in part by microwave source 109 which couples microwave energy through microwave window 110 into reservoir 81 and/or reaction chamber 82. If desired, separate microwave sources can be used for reservoir 81 and reaction chamber 82 so that microwave heating in the two regions can be separately controlled. Auxiliary external heater 108 is also provided in order to preheat the apparatus and allow more precise control over the radial temperature gradients. Separate pre-heaters can also be used for gases 88 and 85. An advantage of microwave heating is that energy may be coupled directly to the seed particles so that they can be maintained within the desired reaction temperature range, usefully 950°–1350° C. but preferably 1050°–1100° C. for silicon, while the walls of reaction column 82 and reservoir 81 (if desired) remain at lower temperatures. Such an arrangement is advantageous in that chemical vapor deposition then takes place preferentially on the hotter seed particles while little or none occurs on the cooler walls of the reactor itself. The walls of reaction column 82 and reservoir 81 are cooled relative to the seed particles by the passage of input gases 85 and 88 respectively. Reservoir 81 is desirably kept hotter than reaction column 82 to assist in maintaining the seed particles at the proper temperature. Baffles 111 serve to allow escape of harvested particles 105 from base portion 112 of reactor 82 while preventing leakage of microwave radiation being supplied by microwave source 109.

While the system of FIG. 4 has been illustrated for the arrangement in which source gas 88 is in thermal contact with reservoir 81 and injection (non-source) gas 85 is in thermal contact with reaction column 82, it will be apparent to those skilled in the art that the thermal connections could be interchanged without departing from the present invention, provided that source gas 88 is not used as a mixing gas for injection of seed particles 93. This is necessary to avoid agglomeration effects.

Having thus described the invention it will be apparent to those of skill in the art that various modifications can be made within the spirit and scope of the present invention. In particular, the present invention can be used for the harvesting of materials other than silicon, and can operate with seed particles having a variety of different sizes, provided however, that gas velocity 58 or 98 is adjusted so that substantially all particles desired to be recycled are carried through and ejected from the upper end of the reaction column, while those of a larger size are harvested. Further, the high velocity gas which is to provide the lifting action may be fed into the reaction column separately or mixed with either the source gas or the particles or a combination thereof. In

FIG. 2 for example, gas inlets 46 and 49 can both be used as a means for introducing the principal lifting gas flow. In FIG. 4 for example, gas inlet 89 and gas 88 can be used only for lifting while the source gas is introduced separately into mixing chamber 82a, as for example via optional inlet 115. Many variations are possible.

It will also be appreciated by those of skill in the art that the differentiation between the smaller particles which are lifted and transported in the reaction chamber and the larger particles which fall in the reaction chamber is not instantaneous. Rather, there is a smooth transition as a function of the growing particle size as to whether it will rise or fall in a gas stream of a particular velocity. Further the lifting gas velocity is generally not perfectly uniform across the reaction column diameter so that the differentiation action is not perfect. Therefore the harvested particles will have a range of sizes around the predetermined critical size established by the average velocity of the lifting gas. Nevertheless, the differential harvesting action of the reaction system of the present invention has been found to be effective in permitting the seed particles to automatically recirculate within the reactor without agglomeration until they have achieved a significant and useful increase in size as a result of chemical vapor deposition. It is important that the ratio of size of the harvested particles, and hence $D_o$, relative to the seed particles be as large as possible since this increases the efficiency of the reactor, in that, a smaller weight of seed particles is require to extract the same weight of silicon from the source gases. Thus, large values of $V_o$, e.g. $>0.5$ m/sec, are desirable.

Further, while the present invention has been described and illustrated in terms of a reactor system having the reservoir concentrically arranged surrounding the reaction column, and while this provides important advantages such as reducing heat loss, and giving angularly symmetric and more uniform particle flow, many advantages of the present invention such as improved gas-particle contact, improved efficiency, no particle agglomeration, reduced maintenance, absence of support plates, particle transport and differential harvesting, continuous and automatic particle recycling until the desired amount of CVD has been obtained, as well as other advantages and improvements, can be obtained with other reaction column-reservoir configurations. For example, a side by side configuration could be used so long as the connecting elements for automatically and continuously recirculating the seed particles without agglomeration, injecting the necessary mixing and lifting gases, adding new particles and removing enlarged particles, and so forth, as have been described in connection with FIGS. 2 and 4, are provided.

In addition, while the present means and method has been described in terms of chemical vapor deposition, other types of reactions can also be performed, not only deposition reactions where the coating on the seed particles is derived solely from the source gas, but also reactions wherein the coating or material which increases the size of the seed particles is derived in part from the seed particles themselves. For example, seed particles may also be reacted to have a coating comprising a nitride, an intermetallic, or a compound semiconductor. By way of illustration a seed particle of silicon can be coated with $TiSi_2$ by reacting a titanium bearing source gas with the silicon seed particle itself so that the seed particle supplies the silicon for the $TiSi_2$ coating, or the $TiSi_2$ coating could be obtained by decompositing source gases containing both titanium and silicon. Many other variations are possible.

It is intended to encompass all such variations as fall within the spirit and scope of the invention.

We claim:

1. A recirculating reactor system for reacting seed particles with a source gas, comprising:
    a reservoir for receiving said seed particles and having an input and output;
    a reactor having an input and an output coupled to said reservoir, adapted to permit lifting and transport of particles of less than a first predetermined size which is larger than said seed particles, from said reactor input to said reactor output;
    first mixing means coupled to said output of said reservoir for receiving seed particles from said reservoir and for forming a first gas-particle mixture with an input non-source gas;
    second mixing means coupled to said input of said reactor for receiving said first gas-particle mixture and for forming a second gas-particle mixture by combining said first gas-particle mixture with a gas comprising said source gas while preventing feedback leakage of said source gas into said reservoir, and wherein said second gas-particle mixture is delivered to said input of said reactor;
    lifting gas inlet means coupled to said first mixing means, said second mixing means, or both mixing means for supplying a lifting gas of a velocity sufficient to produce, within said reactor, said lifting and transport of said particles of less than said first predetermined size;
    separator means coupled to said output of said reactor and said input of said reservoir for separating spent gas and transported particles ejected from said reactor and returning said ejected particles to said reservoir to be reused as seed particles;
    harvesting means coupled to said reactor for harvesting non-ejected particles which have remained in said reactor;
    gas extraction means coupled to said separator means for receiving spent gas from said separator means;
    seed particle injection means coupled to said reservoir for injecting new seed particles into said reservoir; and
    heating means for providing heat to said reactor to promote reaction between said seed particles and said source gas.

2. The reactor system of claim 1 wherein said reactor is substantially cylindrical and wherein said reservoir is substantially concentrically disposed around said reactor and wherein said lifting gas inlet means is coupled to both said first and second mixing means.

3. The reactor system of claim 2 wherein said first mixing means is internal to said reservoir.

4. The reactor system of claim 3 wherein said second mixing means substantially comprises a cylindrical chamber having a portion external to said reactor and internal to said reservoir and wherein said first and second particle mixing means are coupled by a port in said portion of said second mixing means.

5. The reactor system of claim 4 wherein said portion of said second mixing means further comprises a section of reduced diameter adapted to carry said lifting gas and located adjacent said port to facilitate injection of said first gas-particle mixture and reduce feedback leakage of said source gas into said first mixing means and said reservoir.

6. The reactor system of claim 5 wherein said first mixing means comprises a nozzle for emitting a stream of said non-source gas, wherein said nozzle is located within said reservoir and directed toward said port.

7. The reactor system of claim 1 wherein said separator means comprises an expansion chamber for reducing the velocity of said ejected gases to a level below that required to lift and transport said ejected particles.

8. The reactor system of claim 7 wherein said reactor has a first cross-sectional area $A_1$ and said reservoir a second cross-sectional area of annular shape $A_2$ around said reactor, and wherein said separator consists of an expansion chamber coupling said rector and said reservoir and having a third cross-sectional area, $A_3$ and wherein $A_1 = XA_2$ and $A_1 = YA_3$ where X is in the range 0.05 to 0.25, Y is in the range 0.0125 to 0.125 and X/Y is in the range 2 to 10.

9. The reactor system of claim 1 wherein said heating means comprises a microwave source directed at said seed particles for heating said seed particles.

10. A recirculating reactor system for reacting seed particles with a source gas, comprising:
a reservoir for receiving said seed particles and having an input and output;
a reactor having an input and an output coupled to said reservoir, adapted to permit lifting and transport of particles of less than a first predetermined size which is larger than said seed particles, from said reactor input to said reactor output;
first mixing means coupled to said output of said reservoir for receiving seed particles from said reservoir and for forming a first gas-particle mixture with an input non-source gas;
second mixing means coupled to said input of said reactor for receiving said first gas-particle mixture and for forming a second gas-particle mixture by combining said first gas-particle mixture with a gas comprising said source gas while preventing feedback leakage of said source gas into said reservoir, and wherein said second gas-particle mixture is delivered to said input of said reactor;
lifting gas inlet means coupled to said first mixing means, said second mixing means, or said reactor for supplying a lifting gas of a velocity sufficient to produce, within said reactor, said lifting and transport of said particles of less than said first predetermined size;
separator means coupled to said output of said reactor and said input of said reservoir for separating spent gas and transported particles ejected from said reactor and returning said ejected particles to said reservoir to be reused as seed particles;
harvesting means coupled to said reactor for harvesting non-ejected particles which have remained in said reactor;
gas extraction means coupled to said separator means for receiving spent gas from said separator means;
seed particle injection means coupled to said reservoir for injecting new seed particles into said reservoir; and
heating means for providing heat to said reactor to promote reaction between said seed particles and said source gas.

11. The system of claim 10 further comprising cooling means for reducing the temperature of portions of interior walls of said reactor relative to other portions of the system.

12. A process for coating particles with a material reacted at least partially from a source gas, comprising:
introducing seed particles of less than a first predetermined size into a reservoir coupled to a reaction chamber;
introducing into said reservoir a first gas, wherein said first gas is a non-source gas;
agitating said seed particles in said reservoir by means of said first gas;
mixing said first gas and a portion of said seed particles to form a first gas-particle mixture;
injecting said first gas-particle mixture into a stream of a gas which comprises said source gas, to form a second gas-particle mixture, without substantial feedback of said source gas into said reservoir;
flowing said second gas-particle mixture through said reaction chamber so as to have a first predetermined gas velocity in said reaction chamber;
regulating said first predetermined gas velocity in said reaction chamber so that particles less than a second predetermined size greater than said first predetermined size are substantially carried through said reaction chamber toward an outlet end;
heating said second gas-particle mixture in said reaction chamber to react said source gas so as to coat said particles with said material, thereby producing larger particles and spent gases;
collecting in said reaction chamber said coated particles whose size is greater than said second predetermined size;
ejecting from said outlet end of said reaction chamber said spent gases and said coated particles whose size is less than said second predetermined size;
decelerating said ejected gases to reduce their velocity and separate said ejected particles from said spent gases;
collecting said ejected particles in said reservoir to provide seed particles for subsequent reactions; and
harvesting said collected particles by extracting said collected particles from said reaction chamber.

13. The process of claim 12 wherein said injecting step further comprises forming said second gas-particle mixture with a lifting gas in an auxiliary mixing chamber prior to admission of said second gas-particle mixture to said reaction chamber.

14. The process of claim 12 or 13 wherein said first predetermined size is less than about 0.6 mm, and wherein said first predetermined velocity is greater than about 0.3 m/s.

15. The process of claim 14 where said decelerating step comprises conducting said partially spent gases from said reaction column into a concentric expansion chamber of a cross-sectional area at least four times the cross-sectional area of said reaction chamber.

16. The process of claim 14 wherein said collecting step further comprises collecting said ejected particles concentrically around said reservoir so as to conserve heat and maintain said seed particles at an elevated temperature for recycling.

17. The process of claim 14 wherein said process is a process for producing silicon and wherein said particles are silicon particles and wherein said material reacted at least partially from a source gas comprises silicon and wherein said source gas contains silicon.

18. The process of claim 12 wherein said heating step comprises irradiating said seed particles with microwaves to cause heating of said seed particles.

19. The process of claim 12 wherein said heating step further comprises cooling a portion of the interior walls said reaction chamber to a temperature less than the temperature of said seed particles in said reservoir.

* * * * *